US010895774B2

(12) United States Patent
Yang

(10) Patent No.: US 10,895,774 B2
(45) Date of Patent: Jan. 19, 2021

(54) ARRAY SUBSTRATE, MANUFACTURING METHOD, DISPLAY PANEL AND DISPLAY DEVICE

(71) Applicant: BOE TECHNOLOGY GROUP CO., LTD., Beijing (CN)

(72) Inventor: Wei Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/985,876

(22) Filed: May 22, 2018

(65) Prior Publication Data

US 2019/0204668 A1     Jul. 4, 2019

(30) Foreign Application Priority Data

Jan. 2, 2018   (CN) .......................... 2018 1 0003159

(51) Int. Cl.
*G02F 1/1335*     (2006.01)
*H01L 27/12*      (2006.01)
(Continued)

(52) U.S. Cl.
CPC ...... *G02F 1/133514* (2013.01); *G02F 1/1368* (2013.01); *G02F 1/133345* (2013.01);
(Continued)

(58) Field of Classification Search
CPC ......... G02F 1/133345; G02F 1/133514; G02F 1/136213; G02F 1/1368;
(Continued)

(56) References Cited

U.S. PATENT DOCUMENTS

2018/0187078 A1*  7/2018 Cheng ............... G02F 1/133514
2018/0233575 A1*  8/2018 Kim .................... H01L 29/6675
(Continued)

FOREIGN PATENT DOCUMENTS

CN    101997025 A    3/2011
CN    103000632 A    3/2013
(Continued)

OTHER PUBLICATIONS

First Office Action for CN Appl. No. 201810003159.7, dated Jan. 2, 2020.

*Primary Examiner* — Nathanael R Briggs
*Assistant Examiner* — William D Peterson
(74) *Attorney, Agent, or Firm* — Dinsmore & Shohl LLP

(57) ABSTRACT

The present disclosure discloses an array substrate, including a first active layer formed on a substrate; a first gate insulating layer on the substrate and the first active layer; a first gate electrode and a second gate electrode formed on the first gate insulating layer; a second gate insulating layer on the first gate insulating layer and the first and second gate electrodes; a second active layer and second source and drain electrodes formed on the second gate insulating layer, the second source and drain electrodes being electrically connected to the second active layer; an interlayer insulating layer on the second gate insulating layer, the second active layer and the second source and drain electrodes; and first source and drain electrodes formed on the interlayer insulating layer, the first source and drain electrodes being electrically connected to the first active layer.

13 Claims, 5 Drawing Sheets

(51) Int. Cl.
*G09G 3/3258* (2016.01)
*H01L 29/66* (2006.01)
*G02F 1/1333* (2006.01)
*G02F 1/1362* (2006.01)
*H01L 29/786* (2006.01)
*G02F 1/1368* (2006.01)

(52) U.S. Cl.
CPC ..... *G02F 1/136213* (2013.01); *G09G 3/3258* (2013.01); *H01L 27/1214* (2013.01); *H01L 27/1225* (2013.01); *H01L 27/1251* (2013.01); *H01L 27/1255* (2013.01); *H01L 29/6675* (2013.01); *H01L 29/7869* (2013.01); *G02F 2001/13685* (2013.01); *G02F 2202/104* (2013.01)

(58) Field of Classification Search
CPC ..... G02F 2001/13685; G02F 2202/104; H01L 27/1214; H01L 27/1251; H01L 27/1225; H01L 27/1255; H01L 29/6675; H01L 29/7869; G09G 3/3258

USPC .......................................................... 349/106
See application file for complete search history.

(56) References Cited

U.S. PATENT DOCUMENTS

2019/0096915 A1\* 3/2019 Hanada ............. H01L 21/02063
2019/0103420 A1\* 4/2019 Liu ..................... H01L 27/1259

FOREIGN PATENT DOCUMENTS

| CN | 202948922 U | 5/2013 |
| CN | 106257677 A | 12/2016 |
| CN | 106558592 A | 4/2017 |
| CN | 106876412 A | 6/2017 |
| CN | 106935549 A | 7/2017 |
| CN | 107452749 A | 12/2017 |

\* cited by examiner

ARRAY SUBSTRATE, MANUFACTURING METHOD, DISPLAY PANEL AND DISPLAY DEVICE

CROSS-REFERENCE TO RELATED APPLICATIONS

The present application claims priority to Chinese Application No. 201810003159.7, filed on Jan. 2, 2018, the disclosure of which is hereby incorporated by reference in its entirety.

FIELD

The present disclosure relates to the field of display technology, and in particular to an array substrate, a manufacturing method, a display panel, and a display device.

BACKGROUND

In recent years, low-temperature polysilicon thin-film transistors (LTPS TFTs) and oxide thin-film transistors (Oxide TFTs) have attracted much attention in the display industry, respectively. LTPS TFTs have the advantages of high mobility and fast charging speed. Oxide TFTs have the advantage of low leakage current. If we can combine the advantages of these two types of materials together, the display devices may facilitate a greatly improved user experience. However, the fabrication processes will inevitably become complicated because the LTPS- and Oxide-TFT processes must be combined together, that is, more Mask processes must be adopted. Since LTPS-TFT and Oxide-TFT fabrication processes may have problems such as process incompatibility, it will become very difficult to reduce the number of Masks. As a result, the cost of this manufacturing process is high.

SUMMARY

According to one aspect of the present disclosure, an array substrate is provided, comprising: a first active layer formed on a substrate; a first gate insulating layer on the substrate and the first active layer; a first gate electrode and a second gate electrode formed on the first gate insulating layer; a second gate insulating layer on the first gate insulating layer and the first and second gate electrodes; a second active layer and second source and drain electrodes formed on the second gate insulating layer, the second source and drain electrodes being electrically connected to the second active layer; an interlayer insulating layer on the second gate insulating layer, the second active layer and the second source and drain electrodes; and first source and drain electrodes formed on the interlayer insulating layer, the first source and drain electrodes being electrically connected to the first active layer.

In one embodiment, the first gate electrode is disposed corresponding to the first active layer, the first active layer being formed of polysilicon; and the second active layer is disposed corresponding to the second gate electrode, the second active layer being formed of an oxide semiconductor.

In one embodiment, the array substrate further includes a first metal layer formed on the first gate insulating layer, the first metal layer being disposed in the same layer as the first gate electrode; a second metal layer formed on the second gate insulating layer in a position corresponding to the first metal layer, the second metal layer being disposed in the same layer as the second source and drain electrodes.

In one embodiment, the array substrate further includes a third metal layer formed on the second gate insulating layer in a position corresponding to the first gate electrode, the third metal layer being disposed in the same layer as the second source and drain electrodes.

In one embodiment, the array substrate further comprises an auxiliary metal portion disposed in the same layer as the first source and drain electrodes on the interlayer insulating layer, the auxiliary metal portion being electrically connected to the second source and drain electrodes.

In one embodiment, the first source and drain electrodes pass through the interlayer insulating layer, the first and second gate insulating layers, and are electrically connected to the first active layer.

According to another aspect of the present disclosure, a manufacturing method of an array substrate is provided, including: forming a first active layer on a substrate; forming a first gate insulating layer on the substrate and the first active layer; forming a first gate electrode and a second gate electrode on the first gate insulating layer; forming a second gate insulating layer above the first gate insulating layer and the first and second gate electrodes; forming a second active layer on the second gate insulating layer; forming second source and drain electrodes on the second gate insulating layer, the second source and drain electrodes being electrically connected to the second active layer; forming an interlayer insulating layer covering the second gate insulating layer, the second active layer and the second source and drain electrodes; forming first source and drain electrodes on the interlayer insulating layer, the first source and drain electrodes being electrically connected to the first active layer.

In one embodiment, the method further comprises forming a first metal layer on the first gate insulating layer when the first gate electrode is formed; and forming a second metal layer on the second gate insulating layer when the second source and drain electrodes are formed.

In one embodiment, the method further comprises forming an auxiliary metal portion on the interlayer insulating layer when the first source and drain electrodes are formed, the auxiliary metal portion being electrically connected to the second source and drain electrodes.

In one embodiment, the first gate electrode is formed corresponding to the first active layer, and the second active layer is formed corresponding to the second gate electrode.

According to another aspect of the present disclosure, a display device is provided, comprising: the array substrate according to any embodiment of the present disclosure.

In one embodiment, the display device further comprises one of the following: a liquid crystal layer and a color filter substrate; or a backplane.

BRIEF DESCRIPTION OF THE DRAWINGS

The embodiments of the present disclosure will be described in detail below in combination with the drawings.

DETAILED DESCRIPTION OF EMBODIMENTS

Figure 1:
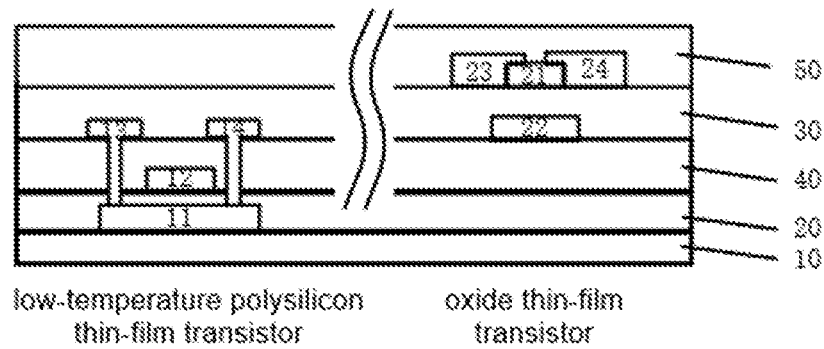
FIG. 1 shows a cross-sectional view of an existing LTPS+ Oxide TFT structure.

In order to more clearly illustrate the concept of the present disclosure, the present disclosure will be further described below in conjunction with the embodiments and the accompanying drawings. Similar parts in the drawings are denoted by the same reference signs. It should be understood by those skilled in the art that the following detailed description is illustrative rather than restrictive, and should not limit the scope of the present disclosure.

The current fabrication processes of combining the low-temperature polysilicon thin-film transistor and oxide thin-film transistor structures is based on the fabrication of LTPS TFTs, to which four Oxide TFT masks, i.e., an oxide thin film transistor gate insulating layer mask, an active layer mask, a source and drain mask, and a passivation layer mask, and the corresponding processing steps are added to form a LTPS+Oxide structure.

As shown in FIG. 1, the left side is a low-temperature polysilicon thin film transistor structure (LTPS TFT), and the right side is a structure of an oxide TFT. It should be noted that this figure is a schematic diagram for illustrating the relationship of layer structures in the thin film transistor, and the wave lines shown in the figure are only used to distinguish the two types of thin film transistor. The following diagrams are all represented in this way and will not be explained repeatedly. On a substrate 10, an active layer 11, a gate insulating layer 20, a gate electrode 12, and an interlayer insulating layer 40 of a low-temperature polysilicon thin film transistor are provided in this order. Source and drain electrodes 13 and 14 of the low-temperature polysilicon thin film transistor are disposed on the interlayer insulating layer, and a gate electrode 22 of an oxide thin film transistor is disposed in the same layer as the source and drain electrodes 13 and 14; That is, the source and drain electrodes of the low-temperature polysilicon thin film transistor and the gate electrode of oxide thin film transistor are formed by using the same masking process. Then, a gate insulating layer 30, an active layer 21, source and drain electrodes 23 and 24 and a passivation layer 50 of the oxide thin film transistor are sequentially disposed. In this way, a total of four masking processes are added.

In order to further simplify the manufacturing processes of the LTPS+Oxide TFT structure, the inventor of the present application has adjusted the Oxide TFT structure on the basis of the LTPS TFT structure, so that only two Oxide TFT masks need to be added to form the LTPS+Oxide TFT structure. That is, an oxide thin film transistor active layer mask and a passivation layer mask are added, that is, the gate insulating layer of the oxide thin film transistor is shared with the interlayer insulating layer of the low-temperature polysilicon thin film transistor, and the source and drain electrodes of the oxide thin film transistor are shared with the source and drain electrodes of the low-temperature polysilicon thin film transistor.

Figure 2:
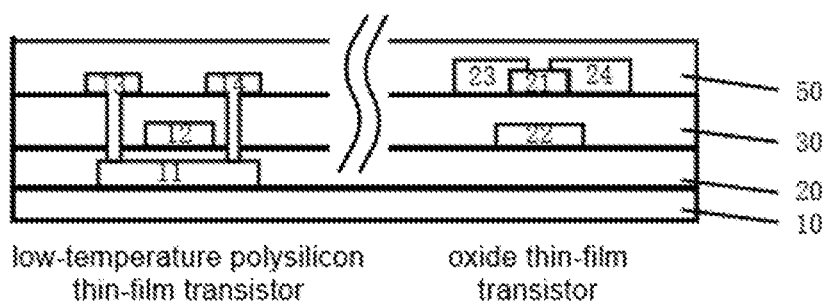
FIG. 2 shows a cross-sectional view of another existing LTPS+Oxide TFT structure.

Specifically, as shown in FIG. 2, the left side is a low-temperature polysilicon thin film transistor structure, and the right side is a structure of an oxide TFT. On a substrate 10, an active layer 11 of a low-temperature polysilicon thin film transistor is disposed, and a gate insulating layer 20 is disposed on the active layer 11 of the low-temperature polysilicon thin film transistor and the substrate 10. A gate electrode 12 of the low temperature polysilicon thin film transistor and the gate electrode 22 of the oxide thin film transistor are provided in the same layer on the gate insulating layer 20 using the same masking process. That is, one mask is utilized for the gates of the two types of thin film transistor. An interlayer insulating layer 30 is disposed on the gate insulating layer 20 and the gates. An active layer 21 of the oxide thin film transistor is disposed on the interlayer insulating layer 30. The source and drain electrodes 13 and 14 of the low temperature polysilicon thin film transistor and the source and drain electrodes 23 and 24 of the oxide thin film transistor are provided using the same masking process, i.e., one mask is utilized for the source and drain electrodes of the two types of thin film transistor. Finally, a passivation layer 50 is disposed on the source and drain electrodes to complete the fabrication of the LTPS+Oxide TFT structure.

Although this structure can reduce two masking processes, there is a problem of process incompatibility in the fabrication of the structure. That is, hydrofluoric acid cleaning is needed to remove an oxide layer on the surface of the active layer 11 of the low-temperature polysilicon thin film transistor before fabricating the source and drain electrodes of the low-temperature polysilicon thin film transistor to ensure that the active layer 11 and the source-drain metal 13, 14 of the low-temperature polysilicon thin film transistor can form a good Ohmic contact therebetween. However, the hydrofluoric acid cleaning may completely etch away the previously formed pattern of the active layer 21 of the oxide thin film transistor, resulting in abnormal characteristics of the oxide thin film transistor.

Figure 3:
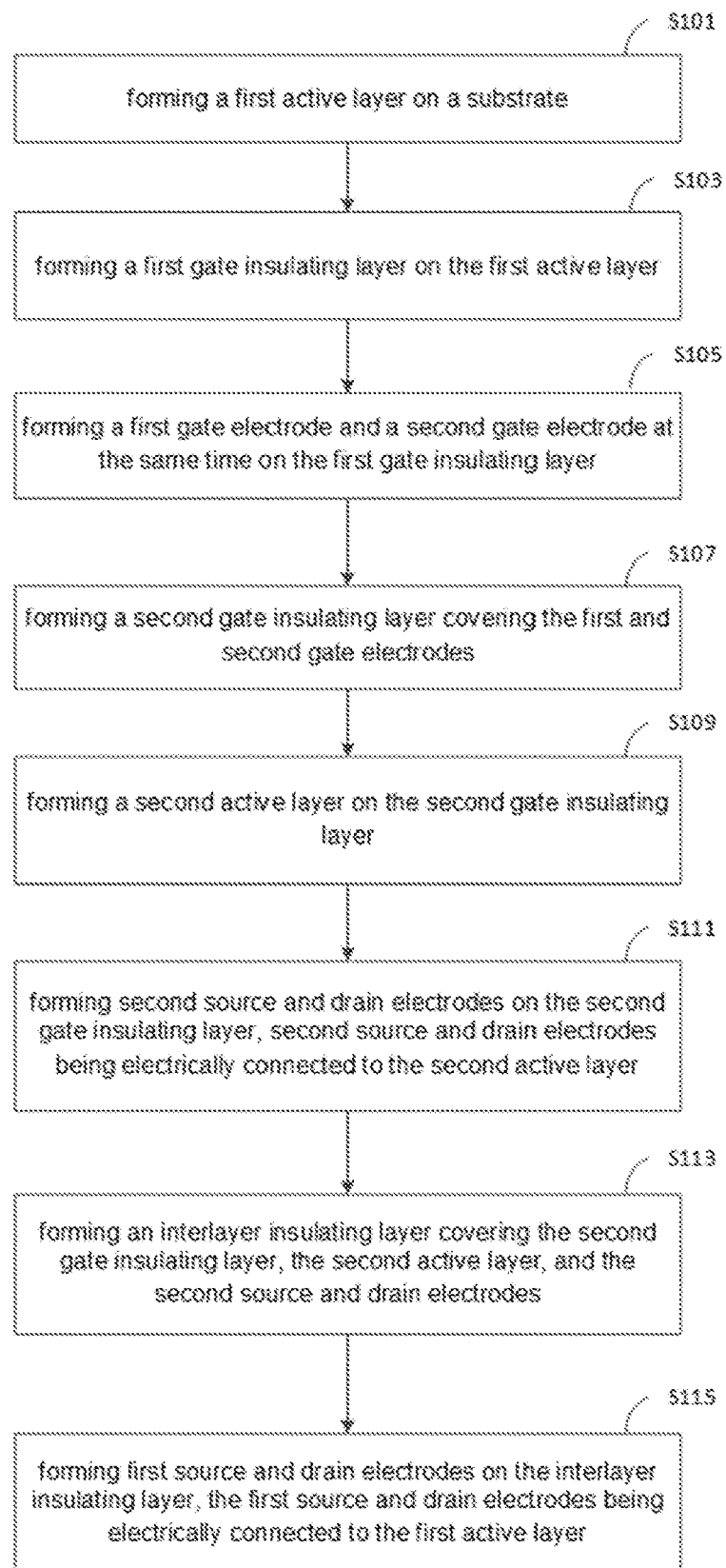
FIG. 3 shows a flowchart of manufacturing an array substrate according to an embodiment of the present disclosure.
Figure 4:
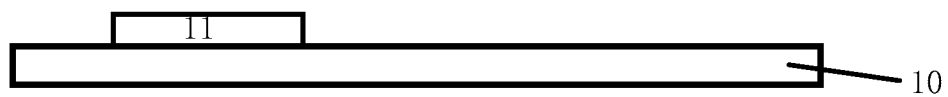
FIGS. 4-11 show cross-sectional views corresponding to respective stages in the manufacturing flow of the array substrate according to an embodiment of the present disclosure.

In order to solve the above problem and further reduce the number of masks used, as shown in FIG. 3, one embodiment of the present disclosure provides a method for manufacturing an array substrate, comprising:

step S101: forming a first active layer 11 on a substrate 10, as shown in FIG. 4.

The substrate of the array substrate of the present disclosure may be a glass or polyimide substrate, and the present embodiment is illustrated with a glass substrate as an example.

In some embodiments, a buffer layer may be disposed on the glass substrate 10 to prevent substances in the substrate from diffusing to the various film layer structures on the substrate during a subsequent process such as the crystallization of a semiconductor layer, which otherwise may affect the quality of the array substrate.

An amorphous silicon (a-Si) layer is deposited on the substrate 10 and the amorphous silicon (a-Si) layer is annealed through an excimer laser annealing (ELA) process to form a polysilicon (p-Si) layer. The polysilicon (p-Si) layer is etched using a patterned mask to form a first active layer 11. As such, the polysilicon active layer 11 serves as an active layer of a low-temperature polysilicon thin film transistor. Since the annealing process for forming the polycrystalline semiconductor layer may affect an oxide semiconductor layer, in some embodiments, the annealing process for manufacturing the active layer of the low-temperature polysilicon thin film transistor is performed before providing the metal oxide of the active layer of the oxide thin film transistor.

Figure 5:
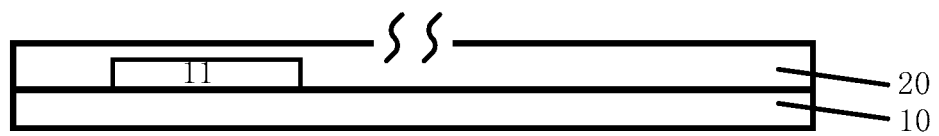

The method further comprises: in step S103, forming a first gate insulating layer 20 on the substrate and the first active layer 11, as shown in FIG. 5.

The first gate insulating layer 20 covered on the active layer 11 of the low-temperature polysilicon thin film transistor can serve as a gate insulating layer of a low-temperature polysilicon thin film transistor. The first gate insulating layer 20 may also serve as an additional buffer layer under the gate electrode (which will be formed later) of the oxide thin film transistor.

Figure 6:
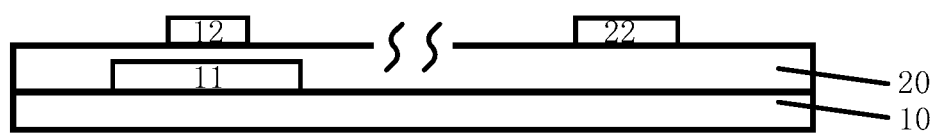

The method further comprises: in step S105, forming a first gate electrode 12 and a second gate electrode 22 on the first gate insulating layer 20, as shown in FIG. 6. The first gate electrode is provided corresponding to the first active layer.

In a specific example, the first gate electrode 12 and the second gate electrode 22 may be formed by forming a gate material layer (e.g., a metal layer) on the first gate insulating layer 20, etching the gate material layer using a patterned mask to form the first gate electrode 12 and the second gate electrode 22. The first gate electrode 12 and the second gate electrode 22 correspond to the gate electrode of the low-temperature polysilicon thin film transistor and the gate electrode of the oxide thin film transistor, respectively. That is, the gates of the two types of thin film transistor are disposed in the same layer, so that the number of masks used in the fabrication processes of the LTPS+Oxide TFT structure can be reduced.

Figure 12:
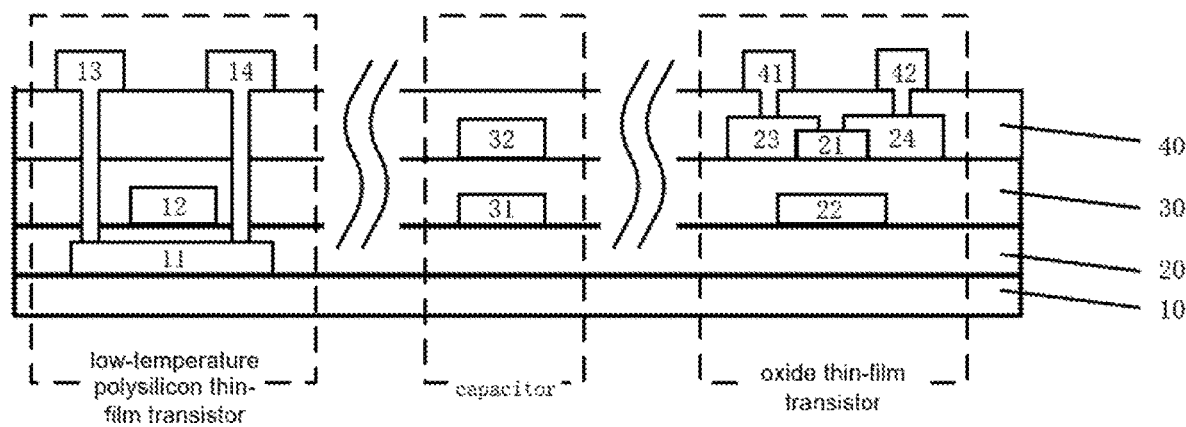
FIG. 12 shows a cross-sectional view of an array substrate according to another embodiment of the present disclosure.

In some embodiments, as shown in FIG. 12, a first metal layer 31 is further formed on the first gate insulating layer 20 while forming the first gate electrode 12 using the mask. The first metal layer 31 can serve as a first metal electrode plate of a storage capacitor on the array substrate. The storage capacitor can be used in an OLED pixel circuit to compensate for a threshold voltage for driving a thin film transistor. This structure can make full use of the existing masking process and reduce the production cost.

Figure 7:
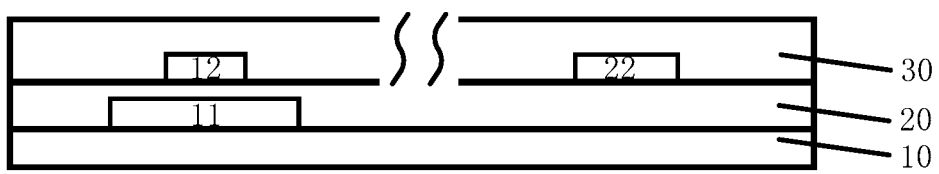

The method further comprises: in step S107, forming a second gate insulating layer 30 on the first gate insulating layer and the first and second gate electrodes 12 and 22, as shown in FIG. 7.

As shown in FIG. 7, the second gate insulating layer 30 covered on the second gate electrode 22 may serve as a gate insulating layer of an oxide thin film transistor. It should be noted here that the embodiment of the present disclosure can be applied to various display panels or display devices. Although the specific function of the insulating layer served in the thin film transistor may be different in different embodiments, the embodiment of the present disclosure may also be applied to a display panel and a display device including a backplane. For example, some insulating layers used to form oxide thin film transistors on a backplane can also be used as insulating layers for low temperature polysilicon thin film transistors and vice versa. In the present embodiment, the low-temperature polysilicon thin film transistor and the oxide thin film transistor share the second gate insulating layer to reduce the number of masks used in the fabrication processes of the LTPS+Oxide TFT structure.

Figure 8:
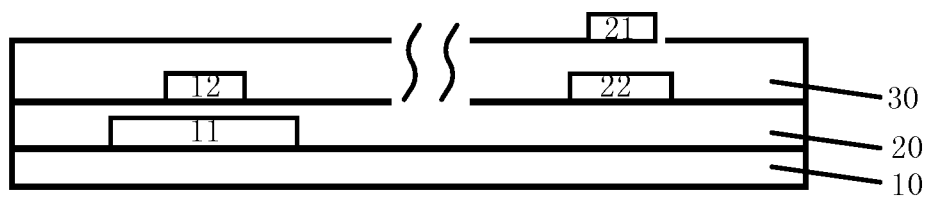

The method further comprises: in step S109, forming a second active layer 21 on the second gate insulating layer 30, as shown in FIG. 8. The second active layer is disposed corresponding to the second gate electrode.

The second active layer 21 can be formed as follows: depositing an oxide semiconductor layer (for example, an indium gallium zinc oxide (IGZO) layer) on the second gate insulating layer 30, and etching the oxide semiconductor layer using a patterned mask to form the second active layer 21. The second active layer 21 may serve as an active layer of the oxide thin film transistor. Indium gallium zinc oxide (IGZO) is a novel semiconductor material having higher electron mobility than a-Si. A single layer of IGZO can be used as a channel material in the oxide thin film transistor. In the present embodiment, a single layer of IGZO is used as an active layer in the oxide thin film transistor. Further, metal oxide materials such as IGZTO, IZO, ZnO, ZnON, and ITZO, etc. may also be used as the active layer of the oxide thin film transistor in the present disclosure.

It should be understood that the materials listed above for forming the first and second active layers are merely illustrative. In some embodiments, the material of the first active layer is different from the material of the second active layer.

Figure 9:
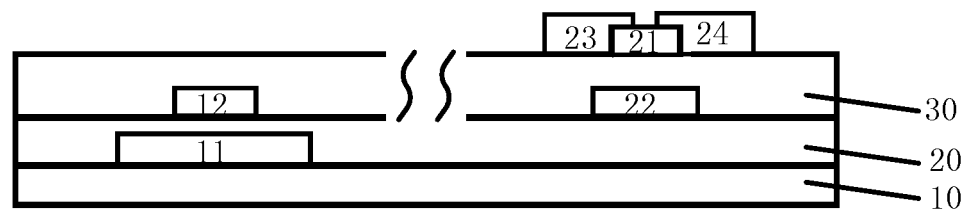

The method further comprises: in step S111, forming second source and drain electrodes 23 and 24 on the second gate insulating layer 30, the second source and drain electrodes 23 and 24 being electrically connected to the second active layer 21, as shown in FIG. 9.

The second source and drain electrodes 23, 24 can be formed as follows: forming an electrode material layer (for example, a metal layer) on the second gate insulating layer 30 and the second active layer 21, and etching the electrode material layer using a patterned mask to form the second source and drain electrodes 23, 24. The second source and drain 23, 24 can serve as the source and drain electrodes of the oxide thin film transistor. The second source and drain electrodes 23, 24 are electrically connected to the active layer 21 of the oxide thin film transistor.

In some embodiments, as shown in FIG. 12, a second metal layer 32 is further formed on the second gate insulating layer 30 when the first source and drain electrodes 23, 24 are formed using the mask. The second metal layer 32 may be disposed in a position corresponding to the first metal layer. The second metal layer 32 can serve as a second metal electrode plate of the storage capacitor on the array substrate. The storage capacitor is used in an OLED pixel circuit to compensate for a threshold voltage for driving a thin film transistor. This structure can make full use of the existing masking process and reduce the production cost.

Figure 13:
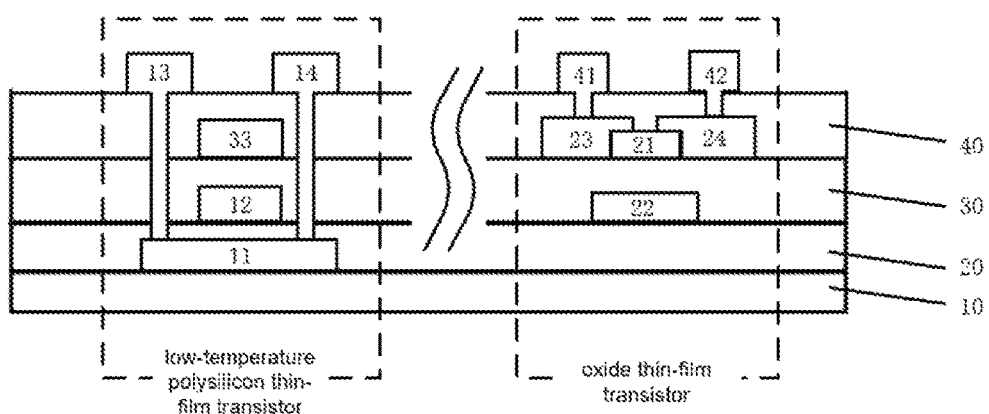
FIG. 13 shows a cross-sectional view of an array substrate according to another embodiment of the present disclosure.

In some embodiments, as shown in FIG. 13, a third metal layer 33 is further formed on the second gate insulating layer 30 when the first source and drain electrodes 23, 24 are formed using the mask. The third metal layer 33 may be disposed in a position corresponding to the first gate electrode. The third metal layer 33 can serve as a second metal electrode plate of a storage capacitor on the array substrate, which forms the storage capacitor of the array substrate with the first gate electrode. The storage capacitor is used in an OLED pixel circuit to compensate for a threshold voltage for driving a thin film transistor. This structure can make full use of the existing masking process and reduce the production cost.

Figure 10:
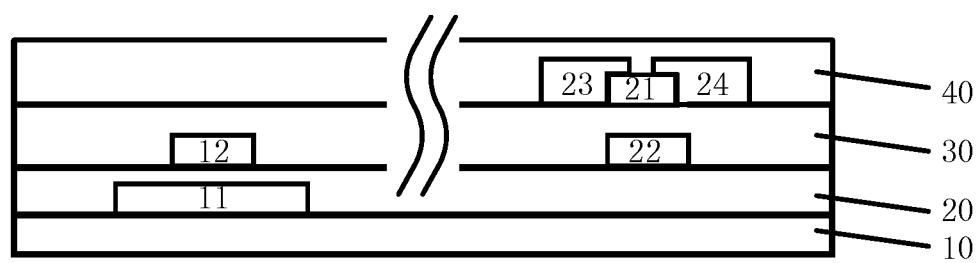

The method further comprises: in step S113, forming an interlayer insulating layer 40 covering the second gate insulating layer 30, the second active layer 21, and the second source and drain electrodes 23, 24, as shown in FIG. 10.

The second gate insulating layer 30, the second active layer 21, and the second source and drain electrodes 23, 24 are covered by the insulating layer 40, which can serve as an interlayer insulating layer of the low-temperature polysilicon thin film transistor, and serve as a passivation layer of the oxide thin film transistor, i.e., an interlayer insulating layer shared by the two types of thin film transistor. Although the specific function of the insulating layer may be different in thin film transistors, some insulating layer used for forming a low temperature polysilicon thin film transistor on a backplane can also be used as the insulating layer of an oxide thin film transistor, and vice versa.

Figure 11:
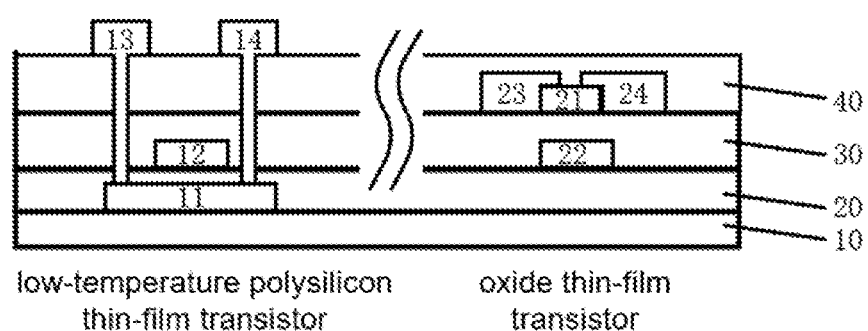

The method further comprises: in step S115, forming first source and drain electrodes 13, 14 on the interlayer insulating layer, the first source and drain electrodes 13, 14 being electrically connected to the first active layer 11, as shown in FIG. 11.

The interlayer insulating layer 40, the second gate insulating layer 30, and the first gate insulating layer 20 may be etched using a patterned mask to form a first via penetrating through the interlayer insulating layer 40, the second gate insulating layer 30 and the first gate insulating layer 20 to reach the first active layer 11. The first via exposes a portion of the first active layer.

In some embodiments, as shown in FIG. 12, a second via may be further formed by the etching process using a mask, the second via penetrating through the interlayer insulating layer 40 to expose the second source and drain electrodes 23, 24. In some embodiments, both of the first via and the second via can be formed in the same etching process using the same mask.

Alternatively, hydrofluoric acid cleaning may be performed by means of the first and second via. Hydrofluoric acid can remove the oxide on the surface of the first active layer 11 through the first via, so that the first active layer 11 has a good ohmic contact with the subsequently deposited source-drain metal. Meanwhile, since the second source and drain electrodes 23, 24 (the source and drain electrodes of the oxide thin film transistor) in the structure may protect the second active layer 21 (the active layer of the oxide thin film transistor), IGZO can be prevented from being etched by the hydrofluoric acid liquid. Thus, the problem of process incompatibility in the fabrication processes of the LTPS+ Oxide TFT structure can be solved.

Thereafter, an electrode material layer (e.g., a metal material layer) may be formed to fill up the formed first via (as well as the second via, if any) and cover the insulating layer 40.

After that, the electrode material layer may be patterned using a patterned mask to form the first source and drain electrodes 13, 14, i.e., the source and the drain electrodes of the low-temperature polysilicon thin film transistor. The first source and drain electrodes 13, 14 correspond to the position of the first active layer 11 and are electrically connected to the first active layer 11 through the first via.

In some embodiments, as shown in FIG. 12, the mask in this step may be further used to form auxiliary metal portions 41 and 42 in a position corresponding to the second via. The auxiliary metal portions 41 and 42 are electrically connected to the source and drain electrodes 23, 24 of the oxide thin film transistor through the second via.

The first active layer may be formed of polysilicon. The first active layer, the first gate electrode, and the first source and drain electrodes constitute a low temperature polysilicon thin film transistor. The second active layer may be formed of an oxide semiconductor. The second active layer, the second gate electrode, and the second source and drain electrodes constitute an oxide thin film transistor.

In this embodiment, the first active layer is an active layer of the low-temperature polysilicon thin film transistor. The first gate electrode, the first source and the drain electrodes correspond to the position of the first active layer, which are the gate electrode, the source and drain electrodes of the low-temperature polysilicon thin film transistor. The second active layer is the active layer of the oxide thin film transistor. The second gate electrode and the second source and drain electrodes correspond to the position of the second active layer, which are the gate electrode and the source and drain electrodes of the oxide thin film transistor.

It should be noted that the steps of the foregoing manufacturing method are only used for the schematic description of the present embodiment, and are not specific limitations. Those skilled in the art may make changes and substitutions within the technical scope disclosed by the present disclosure.

Through the process steps of the above method, an array substrate as shown in FIG. 11 can be obtained. The array substrate includes two types of thin film transistor. The array substrate may include a first active layer formed on a substrate; a first gate insulating layer covering the first active layer; a first gate electrode and a second gate electrode formed in the same layer on the first gate insulating layer; a second gate insulating layer covering the first gate electrode and a second gate electrode; a second active layer and second source and drain electrodes formed on the second gate insulating layer, the second source and drain electrodes being electrically connected to the second active layer; an interlayer insulating layer covering the second active layer and the second source and drain electrodes; first source and drain electrodes formed on the interlayer insulating layer, the first source and drain electrodes being electrically connected to the first active layer.

Further, the first active layer, the first gate electrode, and the first source and drain electrodes are used for a low temperature polysilicon thin film transistor. The second active layer, the second gate electrode, and the second source and drain electrodes are used for an oxide thin film transistor.

Further, as shown in FIG. 12, a first metal layer 31 may be further disposed in the same layer on the first gate insulating layer 20. The first metal layer 31 can serve as a first metal electrode plate of a storage capacitor of the array substrate. A second metal layer 32 is further disposed in the same layer on the second insulating layer 30. The second metal layer 32 can serve as a second metal electrode plate of the storage capacitor of the array substrate. The storage capacitor can be used in an OLED pixel circuit to compensate for a threshold voltage for driving a thin film transistor.

The embodiments of the present disclosure provide a novel LTPS+Oxide TFT structure that has one or more of the following characteristics: a gate electrode of a low-temperature polysilicon thin film transistor, a first metal electrode plate of a storage capacitor of the array substrate, a gate electrode of an oxide thin film transistor are disposed in a same layer, and a gate insulating layer is shared by the low-temperature polysilicon thin film transistor and the oxide thin film transistor, a second metal electrode plate of the storage capacitor of the array substrate and the source and drain electrodes of the oxide thin film transistor are disposed in the same layer, and an interlayer insulating layer of the low-temperature polysilicon thin film transistor is shared with the oxide thin film transistor as its passivation layer. Therefore, the number of masks used for the LTPS+ Oxide TFT structure can be reduced, and the problem of process incompatibility in the fabrication processes of the two types of transistor can be solved. As a result, manufacturing efficiency is improved and costs are reduced.

According to embodiments of the present disclosure, through adjusting the LTPS+Oxide TFT structure, the number of Masks used in the LTPS+Oxide TFT structure can be effectively reduced, and the problem of process incompatibility in the LTPS-TFT and Oxide-TFT fabrication processes can be solved.

Further, in an LCD array substrate, since the low-temperature polysilicon thin film transistor has the advantages of high mobility and fast charging speed, it is generally used as a driving transistor DTFT of a peripheral driving circuit in a non-display area. The oxide thin film transistor is generally used as a switching transistor STFT in a display area because it has the advantage of low leakage current, thereby facilitating low-frequency pixel driving to reduce power consumption.

On the other hand, in an OLED array substrate, since the OLED pixel circuit adopts a structure of a plurality of thin film transistors and a storage capacitor, both the low temperature polysilicon thin film transistor and the oxide thin film transistor can be used as a driving transistor DTFT or a switching transistor STFT.

Further, the number of low-temperature polysilicon thin film transistors/oxide thin film transistors in the array substrate is variable. The array substrate includes low-temperature polysilicon thin film transistors and oxide thin film transistors. In different application scenarios, the number of low-temperature polysilicon thin film transistors and the number of oxide thin film transistors can be set according to actual requirements. It should be apparent to those skilled in the art that FIG. 11 and FIG. 12 are merely exemplary structures for describing the combined fabrication of two different types of thin film transistor, and are not limited to the number of thin film transistors included in the array substrate.

In another aspect of the present disclosure, a display device is provided.

In a case where the display panel is an LCD display panel, it may include the above array substrate, a liquid crystal layer, and a color filter substrate.

In a case where the display panel is an OLCD display panel, it may include the above array substrate and a backplane.

Another embodiment of the present disclosure provides a display device, which comprises the display panel provided in the above embodiment. The display device may be any product or component that has a display function such as a mobile phone, a tablet computer, a television, a display, a notebook computer, a digital photo frame, a navigator, and the like.

Those skilled in the art will recognize that the boundaries between the above-described operations are merely illustrative. Multiple operations may be combined into a single operation, a single operation may be distributed in additional operations, and the execution of the operations may at least partially overlap in time. Moreover, alternative embodiments may include multiple instances of a particular operation, and the order of operations may be altered in other embodiments. However, other modifications, changes and substitutions are also possible. Accordingly, the specification and drawings are to be regarded in an illustrative rather than a restrictive sense.

The word "a/an" used herein is defined as one or more. Similarly, the use of such introductory phrases as "at least one" and "one or more" in the claims should not be construed to imply that: the indefinite article directive to another claim element limits any particular claim containing such directed claim elements to an invention containing only one such element, even if the same claim contains the introductory phrase "one or more" or "at least one", as well as an indefinite article (e.g., "a"). The same applies to the use of definite articles. Unless otherwise indicated, words such as "first" and "second" are used to arbitrarily distinguish the elements described by such words. Thus, these words are not necessarily intended to indicate the chronological or other order of such elements. The fact that certain measures are recited in different claims does not indicate that a combination of these measures cannot be used to advantage.

It will also be understood that when the word "comprises/comprising" is used herein, it is intended that there is a stated feature, integer, step, operation, element, and/or component, but does not preclude the presence or addition of one or more other features, integers, steps, operations, elements, and/or components and/or a combination thereof.

Obviously, the above embodiments of the present disclosure are merely examples for clearly illustrating the present disclosure, rather than limiting the embodiments of the present disclosure. For those of ordinary skill in the art, other variations or changes may be made on the basis of the above description, and it is not possible to exhaustively illustrate all the embodiments herein. Any obvious modifications or changes derived from the technical solution of the present disclosure still fall within the protection scope of the present disclosure.

The invention claimed is:

1. An array substrate comprising:
   a first active layer on a substrate;
   a first gate insulating layer on the substrate and the first active layer;
   a first gate electrode and a second gate electrode on the first gate insulating layer;
   a second gate insulating layer on the first gate insulating layer and the first and second gate electrodes;
   a second active layer and second source and drain electrodes on the second gate insulating layer, the second source and drain electrodes being electrically connected to the second active layer;
   a conductive layer disposed on the second gate insulating layer and overlapping the first gate electrode with a part of the second active layer interposed therebetween, and the conductive layer and the first gate electrode functioning as electrodes of a capacitor;
   an interlayer insulating layer covering the second gate insulating layer, the second active layer, the conductive layer, and the second source and drain electrodes;
   first source and drain electrodes formed on the interlayer insulating layer, the first source and drain electrodes being electrically connected to the first active layer; and
   an auxiliary metal portion disposed in a same layer as the first source and drain electrodes on the interlayer insulating layer, the auxiliary metal portion being electrically connected to the second source and drain electrodes,
   wherein the interlayer insulating layer is configured to be in contact with a part of an upper surface of the second active layer.

2. The array substrate according to claim 1, wherein
   the first gate electrode is disposed corresponding to the first active layer, the first active layer being formed of polysilicon; and
   the second active layer is disposed corresponding to the second gate electrode, the second active layer being formed of an oxide semiconductor.

3. The array substrate according to claim 1, further comprising:
   a first metal layer formed on the first gate insulating layer, the first metal layer being disposed in the same layer as the first gate electrode;
   a second metal layer formed on the second gate insulating layer in a position corresponding to the first metal layer, the second metal layer being disposed in the same layer as the second source and drain electrodes.

4. The array substrate according to claim 1, further comprising a third metal layer formed on the second gate insulating layer in a position corresponding to the first gate electrode, the third metal layer being disposed in the same layer as the second source and drain electrodes.

5. The array substrate according to claim 1, wherein the auxiliary metal portion is formed with a same layer as the first source and drain electrodes on the interlayer insulating layer.

6. The array substrate according to claim 1, wherein the first source and drain electrodes are electrically connected to the first active layer through the interlayer insulating layer and the first and second gate insulating layers.

7. A display device, comprising: the array substrate according to claim 1.

8. The display device according to claim 7, further comprising one of
a liquid crystal layer and a color filter substrate; or
a backplane.

9. A manufacturing method of an array substrate, comprising:
forming a first active layer on a substrate;
forming a first gate insulating layer on the substrate and the first active layer;
forming a first gate electrode and a second gate electrode on the first gate insulating layer;
forming a second gate insulating layer above the first gate insulating layer and the first and second gate electrodes;
forming a second active layer on the second gate insulating layer;
forming second source and drain electrodes on the second gate insulating layer, the second source and drain electrodes being electrically connected to the second active layer;
forming a conductive layer on the second gate insulating layer, the conductive layer overlapping the first gate electrode with a part of the second active layer interposed therebetween, and the conductive layer and the first gate electrode functioning as electrodes of a capacitor,
forming an interlayer insulating layer covering the second gate insulating layer, the second active layer, the conductive layer, and the second source and drain electrodes;
forming first openings in the interlayer insulating layer, the second gate insulating layer, and the first gate insulating layer, the first openings extending to the first active layer;
cleaning the first active layer through the openings with hydrofluoric acid;
forming a second opening in the interlayer insulating layer, the second opening extending to one of source and drain electrodes; and
forming first source and drain electrodes and an auxiliary metal on the interlayer insulating layer with a mask, the first source and drain electrodes filling the respective openings and being electrically connected to the first active layer, and the auxiliary metal being electrically connected to the one of the second source and drain electrodes through the second opening,
wherein the interlayer insulating layer is in contact with a part of an upper surface of the second active layer.

10. The manufacturing method according to claim 9, further comprising:
forming a first metal layer on the first gate insulating layer when the first gate electrode is formed; and
forming a second metal layer on the second gate insulating layer when the second source and drain electrodes are formed.

11. The manufacturing method according to claim 9, wherein
the first gate electrode is formed corresponding to the first active layer, and the second active layer is formed corresponding to the second gate electrode.

12. The manufacturing method according to claim 9, wherein
the first active layer comprises low-temperature polysilicon (LTPS), and
the second active layer comprises oxide semiconductor.

13. The array substrate according to claim 1, wherein
the first active layer comprises low-temperature polysilicon (LTPS), and
the second active layer comprises oxide semiconductor.

* * * * *